United States Patent

Sumi et al.

[11] Patent Number: 5,979,044
[45] Date of Patent: Nov. 9, 1999

[54] FABRICATION METHOD OF MULTILAYER PRINTED WIRING BOARD

[75] Inventors: Shinji Sumi; Kouichi Wakashima, both of Toyama, Japan

[73] Assignee: NEC Corporation, Tokyo, Japan

[21] Appl. No.: 09/045,797

[22] Filed: Mar. 23, 1998

[30] Foreign Application Priority Data

Mar. 24, 1997 [JP] Japan .................................. 9-069749

[51] Int. Cl.⁶ .................................................. H05K 3/36
[52] U.S. Cl. ............................ 29/830; 29/840; 29/852; 174/262; 361/760; 361/767
[58] Field of Search .............................. 29/830, 825, 827, 29/840, 852; 174/262; 361/760, 767

[56] References Cited

U.S. PATENT DOCUMENTS

| | | | |
|---|---|---|---|
| 4,496,793 | 1/1985 | Hanson et al. ........................ | 29/830 X |
| 5,481,795 | 1/1996 | Hatakeyama et al. ................. | 29/830 X |
| 5,520,723 | 5/1996 | Okada ...................................... | 29/830 |
| 5,558,928 | 9/1996 | DiStefano et al. ..................... | 29/830 X |
| 5,640,761 | 6/1997 | DiStefano et al. ..................... | 29/830 |
| 5,650,951 | 7/1997 | Gall et al. .............................. | 29/830 |
| 5,727,310 | 3/1998 | Casson et al. ........................... | 29/830 |
| 5,800,650 | 9/1998 | Anderson et al. ..................... | 29/830 X |
| 5,819,406 | 10/1998 | Yoshizawa et al. ................... | 29/830 |
| 5,822,856 | 10/1998 | Bhatt et al. .............................. | 29/830 |
| 5,888,627 | 3/1999 | Nakatami ................................. | 29/830 |

FOREIGN PATENT DOCUMENTS

| | | |
|---|---|---|
| 1-241895 | 9/1989 | Japan . |
| 5-343846 | 12/1993 | Japan . |

*Primary Examiner*—Carl J. Arbes
*Attorney, Agent, or Firm*—Sughrue, Mion, Zinn, Macpeak & Seas, PLLC

[57] ABSTRACT

A fabrication method of a multilayer PWB is provided, which realizes a satisfactorily-high adhesion strength between a mounting pad and a cured resin of a prepreg layer located in a surface via hole. A first surface via hole is formed in a first subboard, and a second surface via hole is formed in a second subboard. Then, the first and second subboards are laminated together while placing an inner structure including a prepreg layer between the first and second subboards. The first and second surface via holes are filled with a resin contained in the prepreg layer. Filler particles are buried into first and second surface regions of the resin which are located in the first and second surface via holes, respectively. The filler particles buried into the first and second surface regions of the resin are removed by dissolving the filler particles, thereby roughening the first and second surface regions of the resin. First and second mounting pads are formed to be contacted with the roughened first and second surface regions of the resin, respectively.

8 Claims, 8 Drawing Sheets

FABRICATION METHOD OF MULTILAYER PRINTED WIRING BOARD

BACKGROUND OF THE INVENTION

1. Field of the Invention

The present invention relates to a fabrication method of a multilayer Printed Wiring Board (PWB) and more particularly, to a fabrication method of a multilayer PWB having surface via holes covered with mounting pads.

2. Description of the Prior Art

A multilayer PWB is typically comprised of two or more subboards laminated with at least one prepreg layer intervening between two adjacent ones of the subboards Each of the subboards is formed by a dielectric substrate and a conductive pattern fixed on one side of the dielectric substrate or two conductive patterns fixed on both sides thereof.

Usually, the conductive patterns of the subboards are electrically interconnected with one another through plated holes penetrating at least one of the subboards and having metal-plated inner walls. An outermost one or two outermost ones of the conductive patterns constitute a predesigned outer circuit or circuits. The remainder of the conductive patterns constitute a predesigned inner circuit or circuits.

To mount surface-mounting electronic components on the Multilayer PWB, mounting pads are provided on the outermost one or two outermost ones of the conductive patterns serving as the outer circuit or circuits.

Some of the plated holes penetrate entirely the multilayer PWB itself from one side to another to electrically interconnect the outer circuit or circuits with some of the inner circuits, which are termed "plated through holes". The plated holes that do not penetrate entirely the multilayer PWB itself from one side to another are termed "plated via holes".

Especially, the plated via holes that penetrate only the outermost one of the laminated subboards to electrically interconnect the outer circuit and a next one of the inner circuits are termed "plated surface via holes".

In recent years, to increase the mounting density of electronic components on a multilayer PWB, mounting pads have been placed not only on the outer circuit or circuits but also on the plated surface via holes. In this case, the plated surface via holes are closed by the mounting pads; in other words, the opening mouths of the plated surface via holes are padded with the mounting pads. Therefore, these via holes may be termed "padded, plated surface via holes".

Multilayer PWBs with padded, plated surface via holes have been becoming practically used more and more widely because of their advantage of the increased mounting density.

Figure 1:
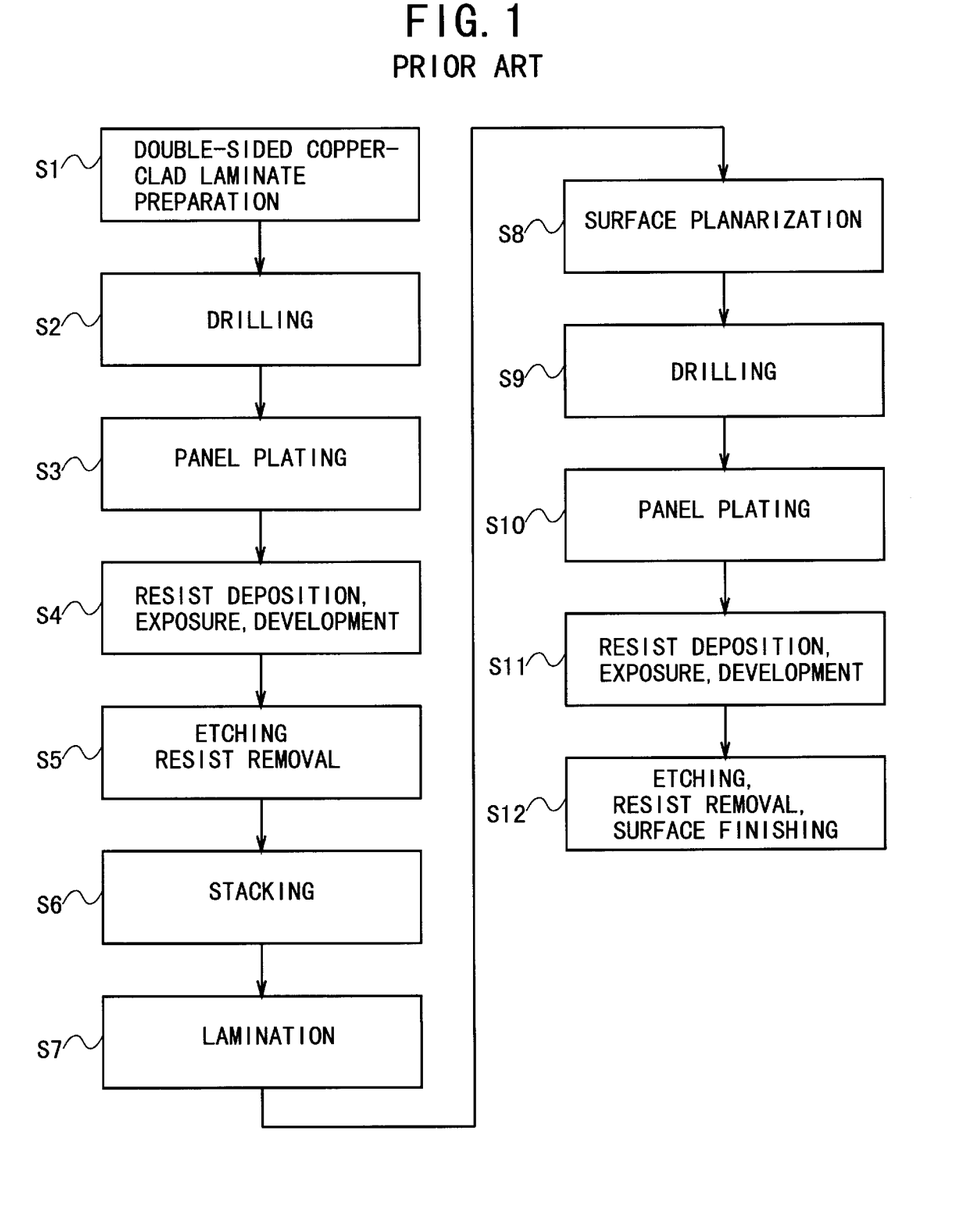
FIG. 1 is a flow chart showing a conventional fabrication method of a multilayer PWB.
Figure 2:
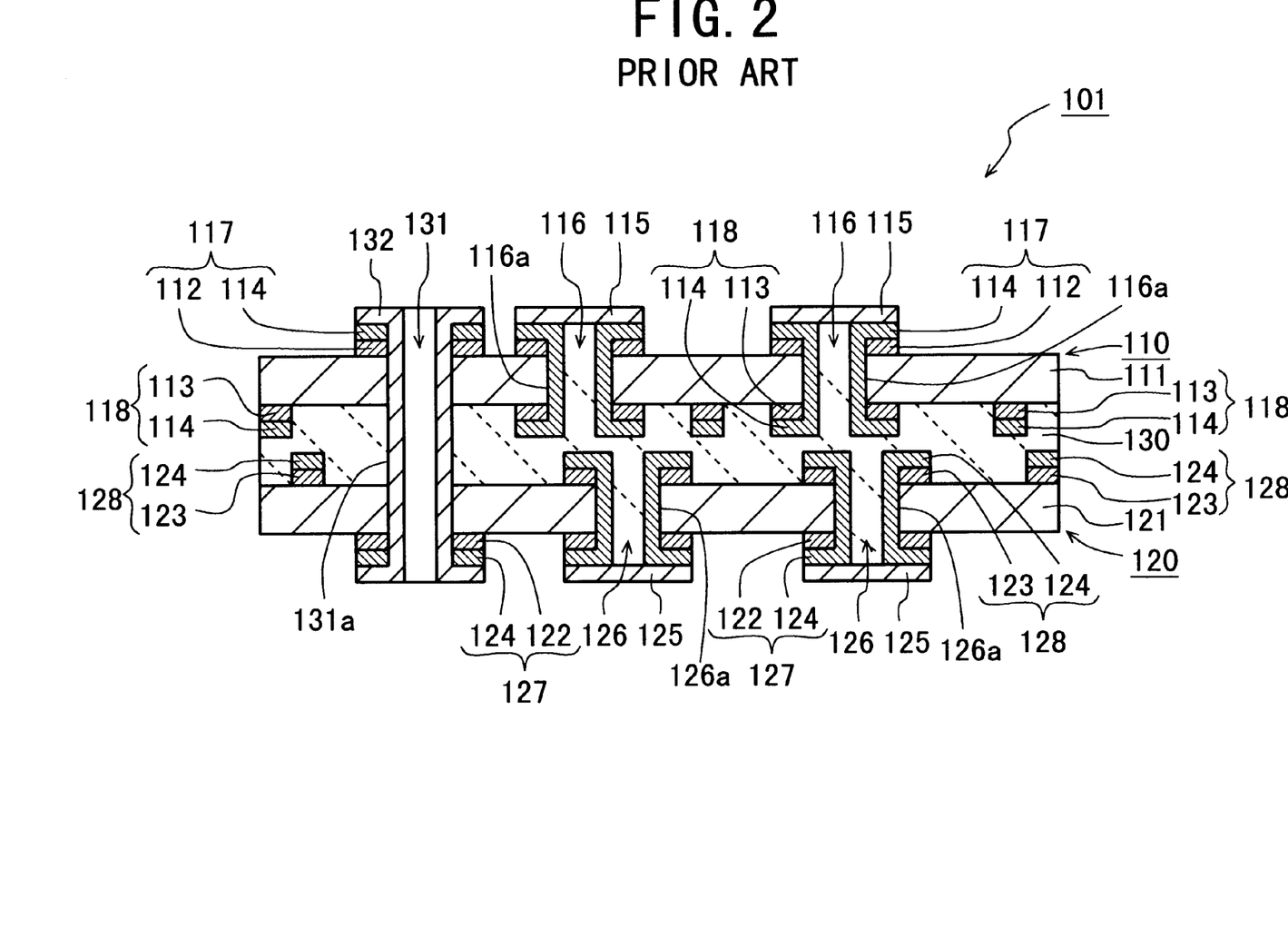
FIG. 2 is a partial cross-section of a multilayer PWB fabricated by the conventional fabrication method shown in FIG. 1.

FIG. 1 shows a flow chart of a conventional fabrication method of a multilayer PWB with padded, plated surface via holes. FIG. 2 shows a part of a multilayer PWB fabricated by this conventional method.

As shown in FIG. 2, a multilayer PWB 101 is comprised of first and second double-sided copper-clad laminates 110 and 120 serving as first and second subboards, and an intervening prepreg layer 130 between the first and second laminates 110 and 120.

The first copper-clad laminate 110 is formed by a dielectric substrate 111, a patterned outer copper foil 112 on the outer side of the substrate 111, and a patterned inner copper foil 113 fixed on the inner side thereof. Holes 116a are formed to penetrate the substrate 111 and the outer and inner copper foils 112 and 113.

Plated copper layers 114 are formed on the outer and inner copper foils 112 and 113 and the inner walls of the holes 116a, respectively. The parts of the plated copper layers 114 formed on the inner walls of the holes 116a serve to electrically interconnect the outer copper foil 112 with the opposing inner copper foil 113. The holes 116a whose inner walls are covered with the copper layers 114 constitute plated surface via holes 116.

The patterned outer copper foil 112 and the parts of the copper layers 114 located thereon constitute a first outer circuit 117. The patterned inner copper foil 113 and the parts of the copper layers 114 located thereon constitute a first inner circuit 118, which is electrically connected to the first outer circuit 117 through the plated surface via holes 116.

Plated copper layers 115, which serve as mounting pads, are formed on the parts of the plated copper layers 114 located over the outer copper foil 112 (i.e., located on the first outer circuit 117).

The second copper-clad laminate 120 is formed by a dielectric substrate 121, a patterned outer copper foil 122 fixed on the outer side of the substrate 121, and a patterned inner copper foil 123 fixed on the inner side thereof. Holes 126a are formed to penetrate the substrate 121 and the outer and inner copper foils 122 and 123.

Plated copper layers 124 are formed on the outer and inner copper foils 122 and 123 and the inner walls of the holes 126a, respectively. The parts of the plated copper layers 124 formed on the inner walls of the holes 126a serve to electrically interconnect the outer copper foil 122 with the opposing inner copper foil 123. The holes 126a whose inner walls are covered with the copper layers 124 constitute plated surface via holes 126.

The patterned outer copper foil 122 and the parts of the copper layers 124 located thereon constitute a second outer circuit 127. The patterned inner copper foil 123 and the parts of the copper layers 124 located thereon constitute a second inner circuit 128, which is electrically connected to the first outer circuit 127 through the plated surface via holes 126.

Plated copper layers 125, which serve as mounting pads, are formed on the parts of the plated copper layers 124 located over the outer copper foil 122 (i.e., located on the second outer circuit 127).

A hole 131a is formed to penetrate the first and second-copper-clad laminates 110 and 120 (i.e., the first and second subboards) and the intervening prepreg layer 130. A plated copper layer 132 is formed on the corresponding parts of the plated copper layers 114 and 124 of the first and second laminates 110 and the inner wall of the hole 131a. the part of the plated copper layer 132 located on the inner wall of the hole 131a serves to electrically interconnect the outer copper foil 112 of the first laminate 110 with the outer copper foil 122 of the second laminate 120. The hole 131a whose inner wall is covered with the plated copper layer 132 constitutes a plated through hole 131.

The multilayer PWB 101 shown in FIG. 2 is fabricated in the following way.

As shown in FIG. 1, first, the first and second copper-clad laminates 110 and 120, which have been cut to have a desired same size, are prepared (step S1).

Next, the holes 116a are formed by drilling to penetrate the first laminate 110, and the holes 126a are formed by drilling to penetrate the second laminate 120 (step S2).

Then, the first and second copper-clad laminates 110 and 120 are subjected to panel electroplating of copper. Thus, the copper layers 114 are formed on the outer and inner copper foils 112 and 113 and the inner walls of the surface via holes 116a of the first laminate 110, and the outer and inner copper foils 122 and 123 and the inner walls of the surface via holes 126a of the second laminate 120, respectively (step S3).

Photoresist films are formed on the inner copper foil 113 of the first laminate 110 and the inner copper foil 123 of the second laminate 120, respectively. Then, the photoresist films are exposed and developed, thereby forming etching masks on the inner copper foil 113 of the first laminate 110 and the inner copper foil 123 of the second laminate 120, respectively (step S4).

Using the etching masks thus formed, the inner copper foil 113 of the first laminate 110 and the inner copper foil 123 of the second laminate 120 are selectively etched using an etching solution such as a water solution of copper chloride. The etching masks are then removed (step S5).

Through the above process steps S1 to S5, the first and second subboards 110 and 120 are prepared. The first subboard 110 has the patterned inner copper foil 113, the unpatterned outer copper foil 112, and the plated holes 116. The second subboard 120 has the patterned inner copper foil 123, the unpatterned outer copper foil 122, and the plated holes 126. The plated holes 116 and 126 will become plated surface via holes after lamination.

Subsequently, the first and second subboards 110 and 120 and the prepreg layer 130 are stacked so that the patterned inner copper foils 113 and 123 are opposite to one another and the prepreg layer 130 is sandwiched by the first and second subboards 110 and 120. Release films are applied onto the outer copper foils 112 and 122 of the first and second subboards 110 and 120, respectively (step S6).

The first and second subboards 110 and 120 and the prepreg layer 130 thus stacked are placed between upper and lower platens of a laminating machine so that the release film applied onto the second subboard 120 is contacted with the lower platen and the release film applied onto the first subboard 110 is contacted with the upper platen. Then, the stack of the first and second subboards 110 and 120 and the prepreg layer 130 is pressed by lowering the upper platen under heat for a preset period, thereby joining them together. Thus, a laminated board is given, which is comprised of the first and second subboards 110 and 120 and the prepreg layer 130 (step S7).

A typical lamination temperature is approximately 170° C., a typical lamination pressure is 8 to 25 atoms, and a typical lamination time is approximately two hours.

During this lamination step, a synthetic resin contained in the prepreg layer 130 is melted due to the applied heat and then, it is slightly pushed or flown out of the holes 116 and 126 of the first and second subboards 110 and 120 due to the applied pressure. The resin of the prepreg layer 130 thus pushed out is cured after the laminated board is cooled down.

After removing the release films from the top and bottom of the laminated board, the top and bottom of the laminated board are planarized to remove the cured, pushed-out resin of the prepreg layer 130 using a belt sander (step S8).

Following this planarizing process, the hole 131 is formed by drilling to entirely penetrate the laminated board itself (step S9).

The laminated board is then subjected to panel electroplating of copper, thereby forming the copper layers 115, 125, and 132 on the plated copper layers 114 and 124 and the inner wall of the hole 131a. The copper-plated via holes 116 and 126 are closed by the plated copper layers 115 and 125, respectively (step S10).

Photoresist films are formed on the top and bottom of the laminated board, respectively. Then, the photoresist films are exposed and developed, thereby forming etching masks on the top and bottom of the laminated board, respectively (step S11).

Finally, using the etching masks thus formed, the outermost copper layers 115 and 116 are selectively etched by an etching solution such as a water solution of copper chloride. Thus, the plated copper layers 115 and 125 are patterned. After removing the etching masks, the top and bottom of the laminated board are subjected to surface finishing, resulting In the multilayer PWB 101 shown in FIG. 2 (step S12).

With the conventional fabrication method as explained above, however, the adhesion or bonding strength between the plated copper layers (or, mounting pads) 115 and 125 and the cured resin of the prepreg layer 130 located in the surface via holes 116 and 126 is not sufficiently high. As a result, there is a problem that the plated copper layers or mounting pads 115 and 125 tend to be apart from the cured resin of the prepreg layer 130 during a mounting or soldering process of surface-mounting electronic components. The possibility of this problem becomes higher as the diameter of the surface via holes 116 and 126 increases.

It is supposed that this problem is caused by the following reason.

Because the cured resin of the prepreg layer 130 pushed out of the surface via holes 116 and 126 during the lamination step S7 is polished with the use of a belt sander in the step S8, the exposed surface of the remaining resin is planarized. The planarized surface of the resin is difficult to be roughened by any conventional preprocess of the panel plating step S10. Accordingly, the anchor effect between the remaining resin of the prepreg layer 130 and the plated copper layers or mounting pads 115 and 125 does not become sufficiently strong.

The Japanese Non-Examined Patent Publication No. 1-241895 published in September 1989 discloses a fabrication method of a multilayer PWB with blind through holes In this method, a patterned copper layer is left on the mouth of a surface via hole by etching and therefore, the mouth of the surface via hole Is flattened due to existence of the patterned copper layer. However, no roughening technique for a cured resin of a prepreg layer is disclosed in this Publication.

The Japanese Non-Examined Patent Publication No. 5-343846 published in December 1993 discloses a fabrication method of a PWB with padded surface via holes. In this method, the exposed surface of a cured resin of a prepreg layer located in a surface via hole is planarized by polishing. However, no roughening technique for a cured resin of a prepreg layer is disclosed in this Publication also.

On the other hand, the following surface-roughening methods (i) to (iv) have been developed to Increase the adhesion or bonding strength between a plated copper layer and a cured resin of a prepreg layer located in a surface via hole.

(i) An embossed release film is used to transfer the bosses of the release film to a cured resin of a prepreg layer located in a surface via hole. The bosses of the release film are transferred to the contacted area of the resin during a lamination step, resulting in the roughened surface of the resin.

(ii) The surface of a cured resin of a prepreg layer is roughened by mechanical polishing using a belt sander or the like.

(iii) The surface of a cured resin of a prepreg layer is roughened by colliding hard particles such as a sand using a sand blasting machine or the like.

(iv) The surface of a cured resin of a prepreg layer is chemically swollen and then, it is etched using a water solution of alkali permanganate, resulting in the roughened surface of the resin.

However, all the surface-roughening methods (i) to (iv) are unable to realize a satisfactorily-high adhesion or bonding strength.

SUMMARY OF THE INVENTION

Accordingly, an object of the present invention is to provide a fabrication method of a multilayer PWB having a padded surface via hole that realizes a satisfactorily-high adhesion strength between a mounting pad and a cured resin of a prepreg layer located in a surface via hole.

Another object of the present invention is to provide a fabrication method of a multilayer PWB having a padded surface via hole in which an adhesion strength of a mounting pad to a cured resin of a prepreg layer located in a surface via hole is readily controlled.

The above objects together with others not specifically mentioned will become clear to those skilled in the art from the following description.

A fabrication method of a multilayer PWB according to the present invention is comprised of the following steps (a) to (h):

In the step (a), a first wiring subboard, a second wiring subboard, and an inner structure are prepared.

The first wiring board has a first conductive layer formed on an inner side, and a first plated via hole penetrating the first wiring subboard.

The second wiring board has a second conductive layer formed on an inner side, and a second plated via hole penetrating the second wiring subboard.

The inner structure includes a prepreg layer.

In the step (b), a first release film having a first filler-containing layer is applied to an outer side of the first wiring subboard so that the first filler-containing layer is contacted with the outer side of the first wiring subboard, and a second release film having a second filler-containing layer is applied to an outer side of the second wiring subboard so that the second filler-containing layer is contacted with the outer side of the second wiring subboard.

Each of the first and second filler-containing layers contains filler particles.

In the step (c), the first subboard, the second subboard, and the inner structure are stacked so that the inner structure is sandwiched by the first and second subboards while the inner sides of the first and second subboards are opposite to one another.

In the step (d), the first and second subboards and the inner structure are laminated together under pressure and heat, thereby forming a laminated board.

The first and second plated via holes are filled with a resin contained in the prepreg layer of the inner structure while forming first and second protruding parts of the resin from the first and second plated via holes, respectively.

The filler particles of the first and second filler-containing layers are diffused into the resin of the prepreg layer located in the first and second plated via holes.

In the step (e), the first and second release films are removed from the first and second subboards, respectively, while the diffused filler particles of the filler-containing layers remain in the resin of the prepreg layer.

In the step (f), the outer sides of the first and second subboards of the laminated board are polished to remove the first and second protruding parts of the resin of the prepreg layer.

In the step (g), the filler particles remaining in the resin of the prepreg layer are removed by dissolving the filler particles to roughen first and second surfaces of the resin located in the first and second plated via holes.

In the step (h), first and second mounting pads are formed on the roughened first and second surfaces of the resin of the prepreg layer located in the first and second plated via holes, thereby covering the first and second plated via holes by the first and second mounting pads, respectively.

With the fabrication method of a multilayer PWB according to the present invention, the first and second release films having the first and second filler-containing layers are used in the step (b), and the filler particles of the first and second filler-containing layers are diffused into the resin of the prepreg layer located in the first and second plated via holes in the step (d). The diffused filler particles are left even after polishing process in the step (f). Subsequently, the remaining filler particles in the resin are removed by dissolving the filler particles to roughen the first and second surfaces of the resin located in the first and second plated via holes.

As a result, the first and second surfaces of the resin have surface roughness large enough for a satisfactory high adhesion or bonding strength between the first and second mounting pads and the resin of the prepreg layer.

Moreover, the distribution and/or density of the filler particles can be readily controlled by adjusting at least one of the amount, size, and sort of the filler particles. Accordingly, the adhesion strength of the first and second mounting pads to the resin of the prepreg layer can be readily controlled.

In the method according to the present invention, the filler particles in the first and second filler-containing layers of the first and second release films may be made of any material if the particles are dissolved and removed from the resin of the prepreg layer. However, it is preferred that the filler particles are made of an inorganic material that is dissolved by contacting the filler particles with a solvent.

In a preferred embodiment of the method according to the present invention, the filler particles are made of one selected from the group consisting of calcium carbonate, silicic acid anhydride, and silica. In this case, the advantages of the present invention are able to be effectively given.

When the filler particles are made of calcium carbonate, it is preferred that the solvent is hydrochloric acid. When the filler particles are made of silicic acid anhydride, it is preferred that the solvent is hydrofluoric acid. When the filler particles are made of silica, it is preferred that the solvent is hydrochloric acid or sulfuric acid.

Any material may be used for a base sheet of the first and second release films if it withstands the pressure during the lamination step (d).

Any material may be used for a binder of the first and second release films if it allows the filler particles to be well dispersed therein and withstands the pressure during the lamination step (d).

BRIEF DESCRIPTION OP THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described below with reference to the drawings attached.

First Embodiment

In a fabrication method of a multilayer PWB according to a first embodiment of the present invention, prior to a lamination process, circuit patterns and via holes are formed at first and second double-sided copper-clad laminates 10 and 20 in the same way as the conventional method shown in FIG. 1.

Figure 3A:
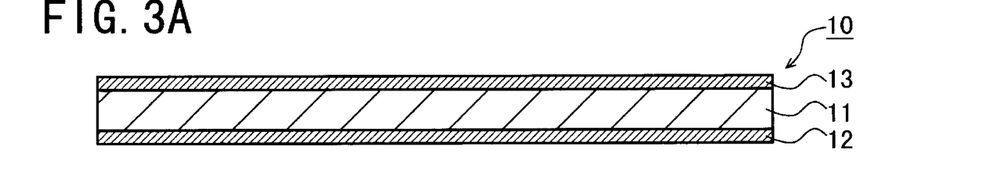
FIGS. 3A to 3K are partial cross-sectional views showing a fabrication method of a multilayer PWB according to a first embodiment of the present invention, respectively.

Specifically, as shown in FIG. 3A, the first copper-clad laminate 10 is formed by a dielectric substrate 11, and copper foils 12 and 13 fixed on both sides of the substrate 11. Each of the copper foils 12 and 13 has a thickness of 12 to 35 μm. The total thickness of the laminate 10 has a thickness of 0.1 to 0.2 mm.

Figure 3B:
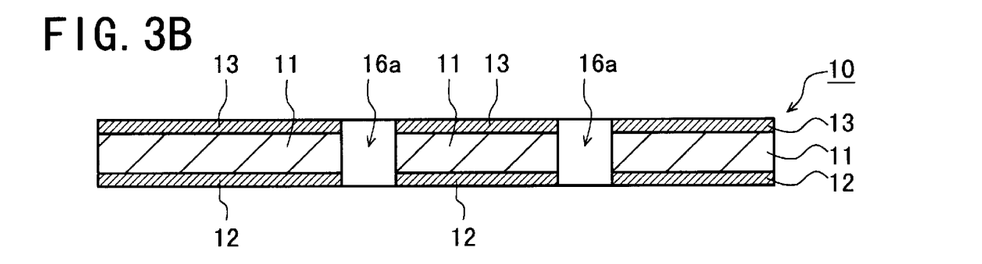

Next, holes 16a are formed by drilling to penetrate the substrate 11 and the copper foils 12 and 13, as shown in FIG. 3B.

Figure 3C:
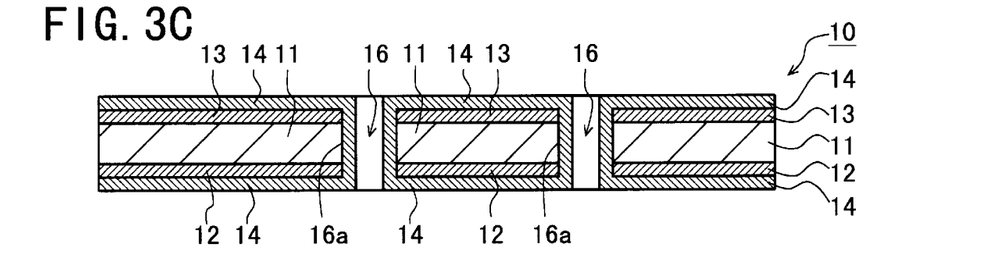

The first copper-clad laminate 10 with the holes 16a is then subjected to a panel plating process of copper, thereby forming a plated copper layer 14, as shown in FIG. 3C. The plated copper layer 14 is formed on not only the copper foils 12 and 13 but also the inner walls of the holes 16a. The penetrating holes 16a whose inner walls are covered with the plated copper layer 14 constitute plated via holes 16.

This panel plating process of copper is usually performed by a combination of an electroless plating step and a subsequent electroplating step. In this case, a thin copper layer is formed in the electroless plating step and then, a thick copper layer is formed on the thin copper layer in the electroplating step.

However, the panel plating process of copper may be performed by an electroplating process alone instead of the combination of an electroless plating step and a subsequent. electroplating step. In this case, prior to the electroplating step, a conductive layer such as an organic or palladium layer is formed. Then, a copper layer is formed on the conductive layer by an electroplating step.

Figure 3D:
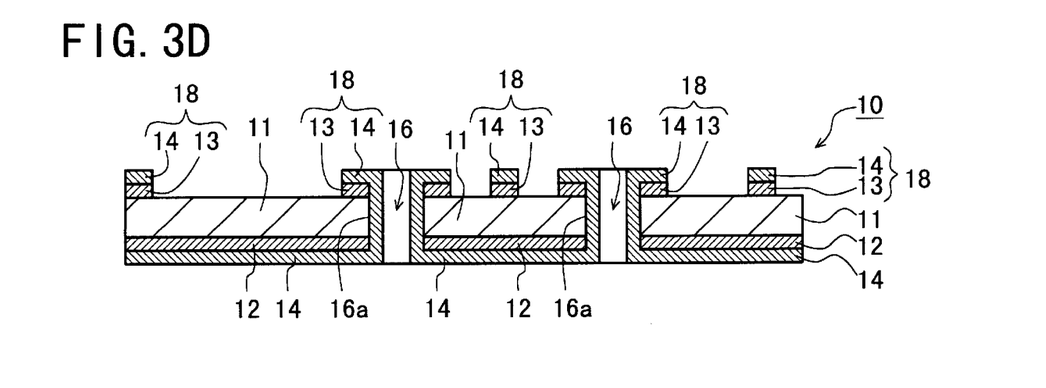

Following the above panel plating process of copper, the copper foil 13 and the overlying part of the plated copper layer 14 are selectively etched to have a predesigned circuit pattern 18, as shown in FIG. 3D.

The second double-sided copper-clad laminate 20 is fabricated in a same way as the first double-sided copper-clad laminate 10 and therefore, explanation about the fabrication processes of the second copper-clad laminate 20 is omitted here for simplification of description.

The first and second copper-clad laminates 10 and 20 serve as first and second subboards of a multilayer PWB.

Figure 3E:
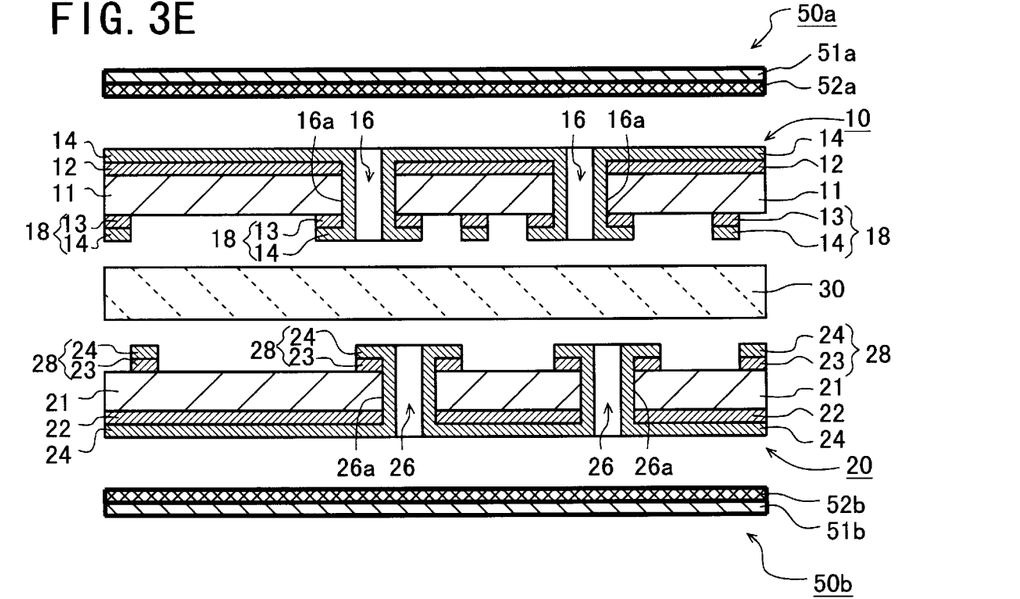

As shown in FIG. 3E, the second copper-clad laminate 20 is formed by a dielectric substrate 21, and copper foils 22 and 23 fixed on both sides of the substrate 21. Each of the copper foils 22 and 23 has a thickness of 12 to 35 μm. The total thickness of the laminate 20 has a thickness of 0.1 to 0.2 mm. Holes 26a are formed to penetrate the substrate 21 and the copper foils 22 and 23.

A plated copper layer 24 is formed on not only the copper foils 22 and 23 but also the inner walls of the holes 26a. The penetrating holes 26a whose inner walls are covered with the plated copper layer 24 constitute plated via holes 26. The copper foil 23 and the overlying part of the plated copper layer 24 are selectively etched to have a predesigned circuit pattern 28.

Subsequently, the first copper-clad laminate 10 with the plated copper layer 14 and the circuit pattern 18 is stacked on the second copper-clad laminate 20 with the plated copper layer 24 and the circuit pattern 28 while a prepreg layer 30 is placed between the first and second laminates 10 and 20, as shown in FIG. 3E. The copper foils 13 and 23 of the laminates 10 and 20 are opposite to one another. The prepreg layer 30 is sandwiched by the laminates 10 and 20.

Although the single prepreg layer 30 is illustrated in FIG. 3E for simplification, it is clear that two or more stacked prepreg layers 30 may be used as necessary. The prepreg layer 30 typically has a thickness of 0.07 to 0.18 mm, and typically contains an epoxy resin as its main ingredient.

At the same time, first and second release films 50a and 50b are applied onto the outer sides of the first and second laminates 10 and 20, respectively. The first release film 50a is formed by a heat-resistant base sheet 51a and a filler-containing layer 52a formed on the base sheet 51a.

For example, the base sheet 51a is made of a synthetic resin such as Teflon and polypropylene. The base sheet 51a may be made of any material that is used for known release films. The filler-containing layer 52a is formed by coating a filler-containing binder material on one side of the base sheet 51a and by curing the filler-containing binder material thus coated. Polyvinyl alcohol is preferably use as the binder material. Particles of calcium carbonate or silicic acid anhydride are preferably used as the inorganic filler particles. The filler particles are dispersed in the binder material. A typical diameter of the filler particles is approximately 5 to 7 μm. A typical compounding ratio of the filler particles is approximately 10 to 30% in weight.

The second release film 50b is formed by a heat-resistant base sheet 51b and a filler-containing layer 52b formed on the base sheet 51b. The base sheet 51b and the filler-containing layer 52b are the same as those of the first release film 51a.

Figure 3F:
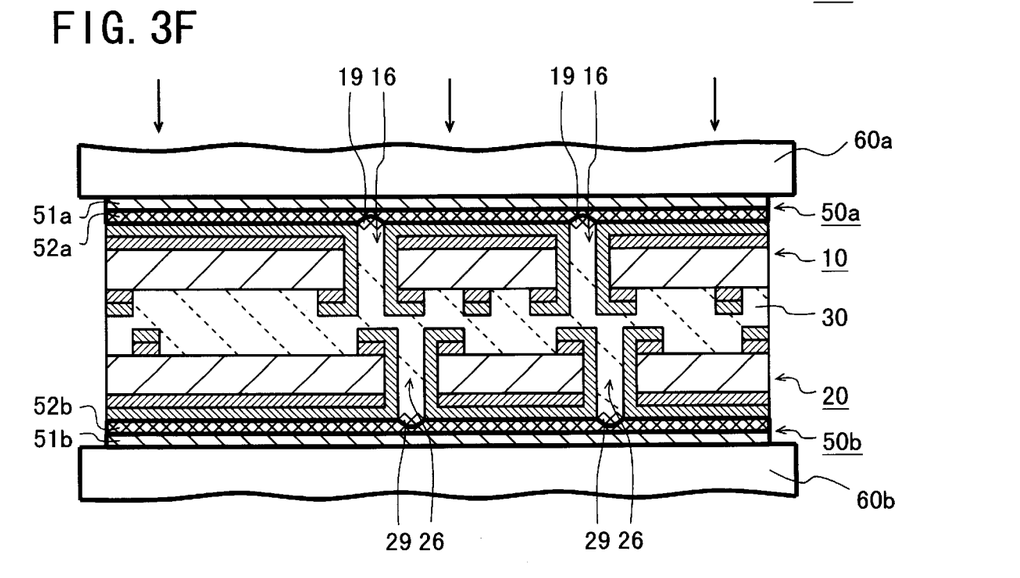

Subsequently, as shown in FIG. 3F, the first and second copper-clad laminates or subboards 10 and 20 and the intervening prepreg layer 30 thus stacked are placed between upper and lower metal platens 60a and 60b of a laminating machine, so that the release film 50b applied onto the outer side of the second subboard 20 is contacted with the lower platen 60b and the first release film 50a applied onto the outer side of the subboard 10 is contacted with the upper platen 60a.

Each of the first and second release films 50a and 50b has a strength that allows to decrease the amount of a pressed resin of the prepreg layer 30. Therefore, it is preferred that the thickness of the first and second release-films 50a and 50b is approximately 25 to 100 μm.

Then, the stacked structure of the first and second laminates or subboards 10 and 20 and the prepreg layer 30 and the first and second release films 50a and 50b is pressed by lowering the upper platen 60a along the arrows in FIG. 3F under heat while the lower platen 60b is fixed, thereby joining them together. Thus, a laminated board is given, which is comprised of the first and second laminates or subboards 10 and 20 and the prepreg layer 30.

A typical lamination temperature is approximately 170° C., a typical lamination pressure is 8 to 25 atoms, and a typical lamination time Is approximately two hours.

During this lamination step, a synthetic resin contained in the prepreg layer 30 is melted due to the applied heat and then, it is slightly pushed or flown out of the plated via holes 16 and 26 of the first and second subboards 10 and 20 due to the applied pressure. The resin of the prepreg layer 30 thus pushed out is cured after the laminated board is cooled down.

In this state, as shown in FIG. 3F, a part of the filler particles 19 contained in the filler-containing layer 52a of the first release film 50a diffuse into the resin of the prepreg 30 located in the mouths of the surface via holes 16. Similarly, a part of the filler particles 29 contained in the first filler-containing layer 52b diffuse into the resin of the prepreg 30 located in the mouths of the surface via holes 26.

Figure 3G:
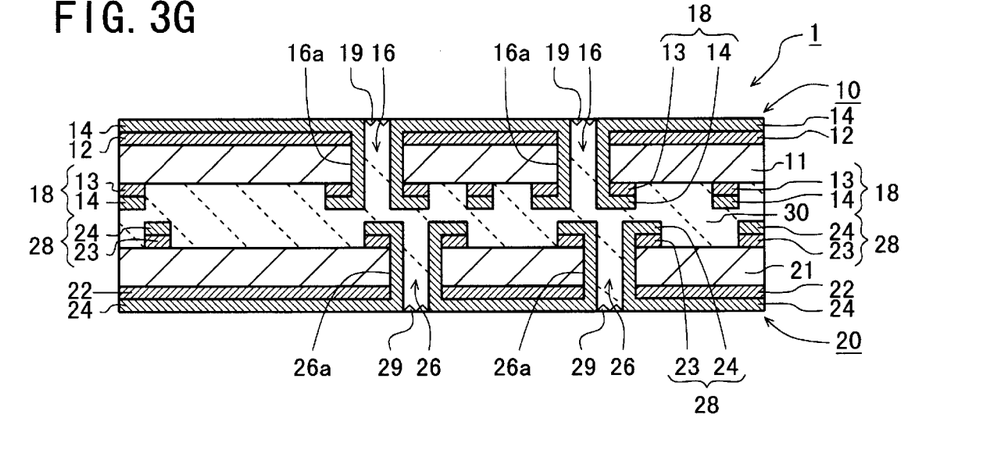

After removing the first and second release films 50a and 50b from the two outer sides of the laminated board, the outer sides of the laminated board are planarized by polishing using a belt sander or the like, thereby removing the cured, pushed-out resin of the prepreg layer 30. The state at this stage is shown in FIG. 3G.

Figure 3H:
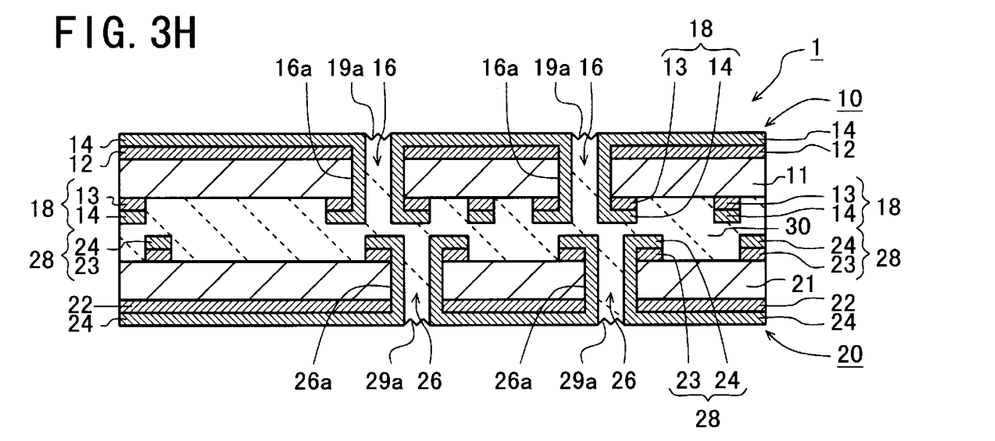

Following this planarizing process, the remaining filler particles 19 and 29 in the resin of the prepreg layer 30 are dissolved by a solvent. Thus, roughed surfaces 19a and 29a are formed at the resin in the plated via holes 16 and 26, as shown in FIG. 3H.

When the filler particles 19 and 29 are made of calcium carbonate, hydrochloric acid is preferably used as the solvent. When the filler particles 19 and 29 are made of silicic anhydride, hydrofluoric acid is preferably used as the solvent.

Figure 3I:
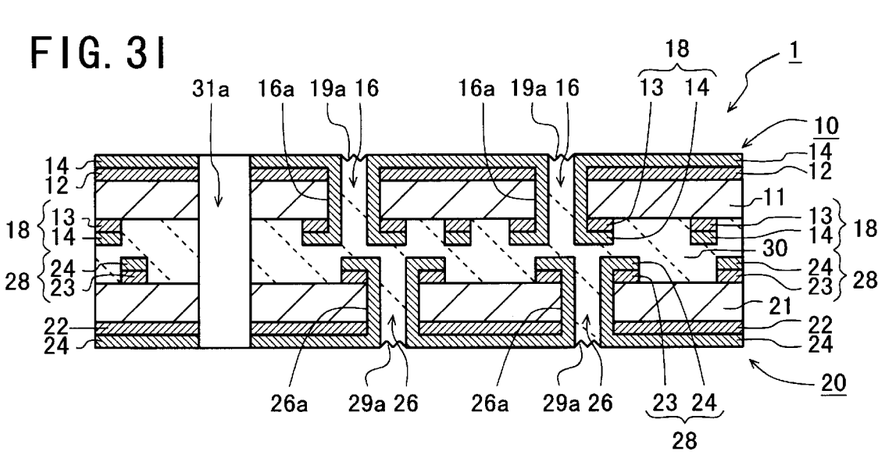

Moreover, a hole 31a is formed by drilling to entirely penetrate the laminated board itself, as shown in FIG. 3I.

Figure 3J:
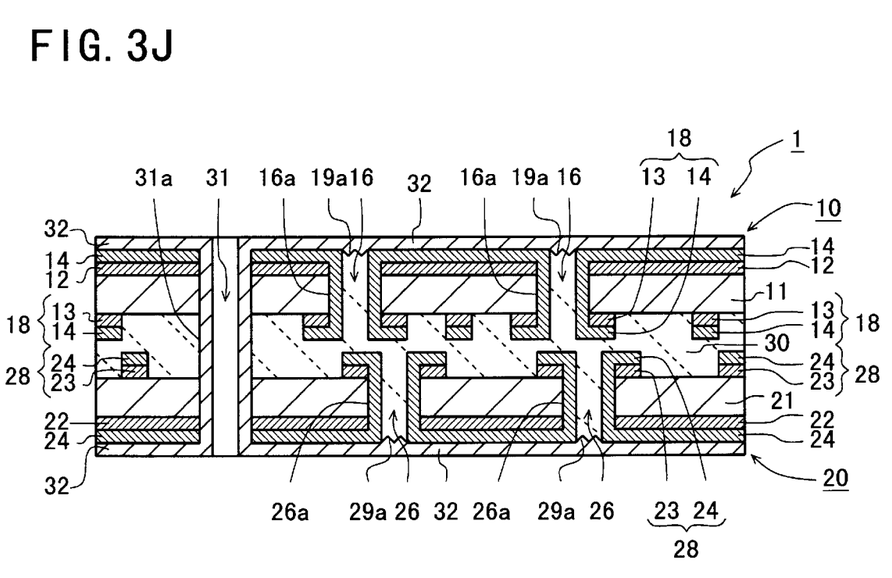

The laminated board is then subjected to panel electroplating of copper, thereby forming copper layers 32 on the plated copper layers 14 and 24 and the inner wall of the hole 31a, as shown in FIG. 3J. The mouths of the copper-plated via holes 16 and 26 are closed by the plated copper layers 32.

Photoresist films (not shown) are formed on the outer sides of the laminated board, respectively, and as a result, the photoresist films are exposed and developed, thereby forming etching masks on the outer sides of the laminated board.

Finally, using the etching masks thus formed, the copper layers 32 are selectively etched by an etching solution such as a water solution of copper chloride. Thus, the plated copper layers 32 are patterned to form mounting pads 15 and 16 on the surface via holes 16 and 26, respectively, as shown in FIG. 3K.

Figure 3K:
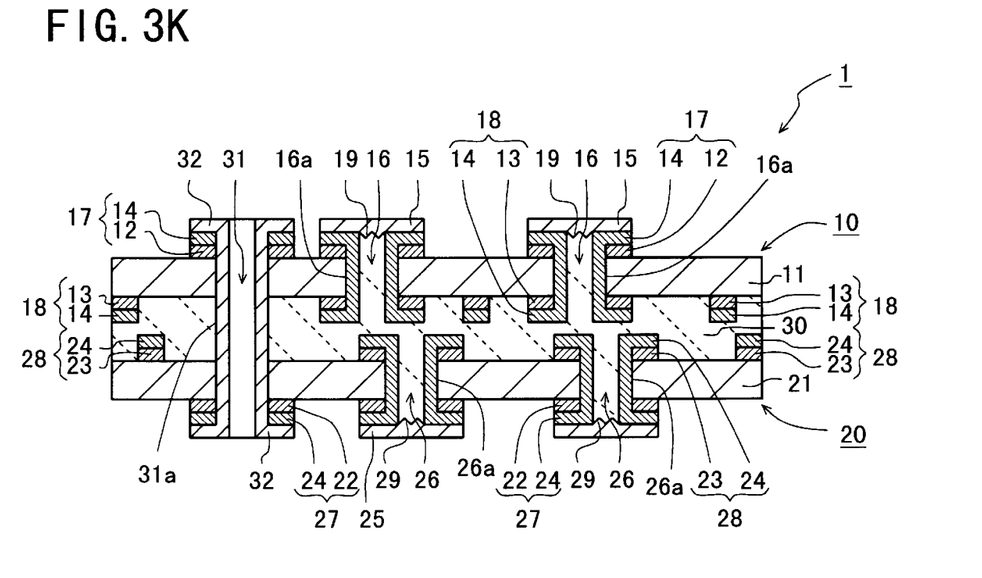

After removing the etching masks, the outer sides of the laminated board are subjected to surface finishing, resulting in a multilayer PWB 1 as shown in FIG. 3K.

With the fabrication method of the multilayer PWB 1 According to the first embodiment, the first and second release films 50a and 50b having the filler-containing layers 52a and 52b are used in the stacking step of FIG. 3E, and the filler particles 19 and 29 dispersed in the filler-containing layers 52a and 52b are diffused into the resin of the prepreg layer 30 located in the plated via holes 16 and 26. The diffused filler particles 19 and 29 are left even after polishing process shown in FIG. 3C. Subsequently, the remaining filler particles 19 and 29 in the resin are removed by dissolving the filler particles 19 and 29 to roughen the surfaces of the resin located in the plated via holes 16 and 26.

As a result, the surfaces of the resin have surface roughness large enough for a satisfactory high adhesion or bonding strength between the mounting pads 15 and 25 and the resin of the prepreg layer 30.

Also, because the filler particles 19 and 29 diffuse into only the surface regions of the resin of the prepreg layer 30, no degradation in electric performance of the multilayer PWB 1 will occur even if the filler particles 19 and 29 are left in the resin.

Moreover, the distribution and/or density of the filler particles 19 and 29 can be readily controlled by adjusting at least one of the amount, size, and sort of the filler particles 19 and 29. Accordingly, the adhesion strength of the mounting pads 15 and 25 to the resin of the prepreg layer 30 is able to be readily controlled.

Second Embodiment

Figure 4:
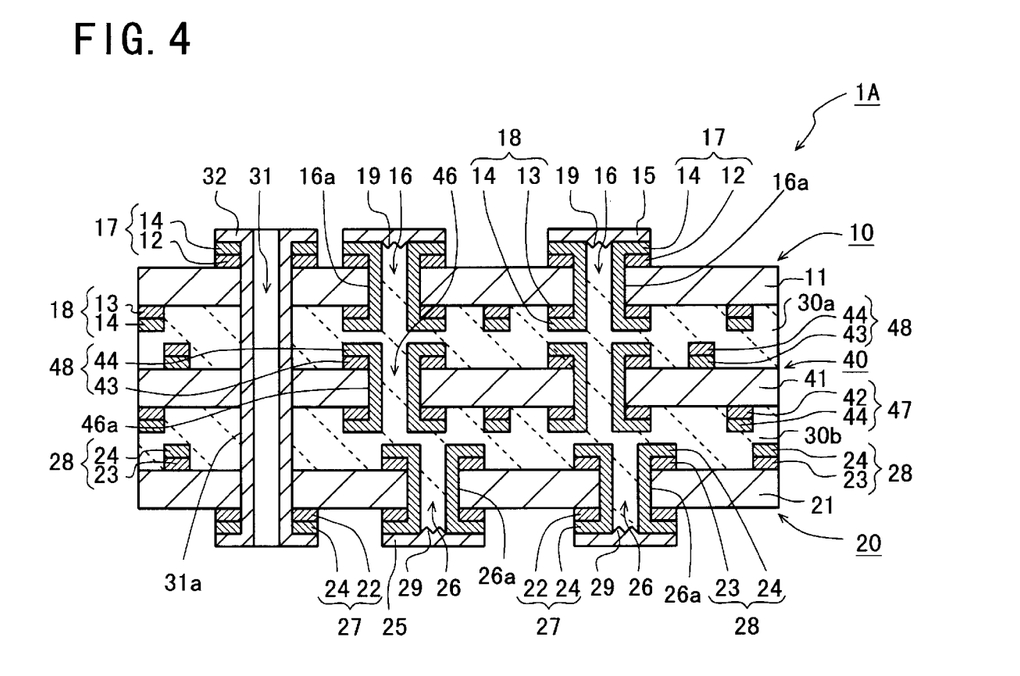
FIG. 4 is a partial cross-sectional view of a multilayer PWB fabricated by a method according to a second embodiment of the present invention.

FIG. 4 shows a multilayer PWB fabricated by a method according to a second embodiment of the present invention.

The method according to the second embodiment has the same process steps as the first embodiment except that (a) a third copper-clad laminate 40 is additionally provided between the first and second laminates or subboards 10 and 20 and that (b) two prepreg layers 30a and 30b are placed between the laminates 10 and 40 and the laminates 20 an 40 instead of the prepreg layer 30.

Therefore, the explanation about the same configuration and process steps is omitted here by attaching the same reference numerals to the same or corresponding parts or elements in FIG. 4 for the sake of simplification of description.

The inner structure sandwiched by the first and second subboards or laminates 10 and 20 is formed by the prepreg layer 30 alone in the multilayer PWB 101 according to the first embodiment. However, the inner structure is formed by the prepreg layers 30a and 30b and the third copper-clad laminate or subboard 40 in a multilayer PWB 1A according to the second embodiment.

Therefore, the process steps of the method according to the second embodiment are given by simply replacing the inner structure formed by the prepreg layers 30a and 30b and the third copper-clad laminate or subboard 40 with the prepreg layer 30 in the steps of FIGS. 3E to 3K.

TEST

To confirm the advantages of the method of the present invention, the inventors performed confirmation test in the following way.

A plurality of multilayer PWBs 101 were fabricated by the conventional method shown in FIG. 1, and then, they were dipped into a molten solder kept at a temperature of 260° C. for 20 seconds. As a result, the plated copper layers 115 and/or 125 were separated from the resin of the prepreg layer 130 located in the plated via holes 116 and 126 with respect to almost all of the PWBs 101.

The separation level or grade of the plated copper layers 115 and/or 125 became higher with the increasing diameter of the plated via holes 116 and 126.

On the other hand, a plurality of multilayer PWBs 1 were fabricated by the method according to the first embodiment shown in FIGS. 3A to 3K. and then, they were dipped into a molten solder kept at a temperature of 260° C. for 20 seconds. As a result, the plated copper layers 15 and/or 25 were not separated from the resin of the prepreg layer 30 located in the plated via holes 16 and 26 with respect to all of the PWBs 1. This was due to the increased adhesion or bonding strength between the plated copper layers 15 and/or 25 and the resin of the prepreg layer 30.

No swelling of the mounting pads 15 and 25 was observed even when the diameter of the plated via holes 16 and 26 was as large as 0.7 mm.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A fabrication method of a multilayer PWB, comprising the steps of:
   (a) preparing a first wiring subboard, a second wiring subboard, and an inner structure;
      said first wiring board having a first conductive layer formed on an inner side, and a first plated via hole penetrating said first wiring subboard;
      said second wiring board having a second conductive layer formed on an inner side, and a second plated via hole penetrating said second wiring subboard;
      said inner structure including a prepreg layer;
   (b) applying a first release film having a first filler-containing layer to an outer side of said first wiring subboard so that said first filler-containing layer is contacted with said outer side of said first wiring subboard, and a second release film having a second filler-containing layer to an outer side of said second wiring subboard so that said second filler-containing layer is contacted with said outer side of said second wiring subboard;
      each of said first and second filler-containing layers containing filler particles;
   (c) stacking said first subboard, said second subboard, and said inner structure so that said inner structure is sandwiched by said first and second subboards while said inner sides of said first and second subboards are opposite to one another;
   (d) laminating said first and second subboards and said inner structure together under pressure and heat, thereby forming a laminated board;
      said first and second plated via holes being filled with a resin contained in said prepreg layer of said inner structure while forming first and second protruding parts of said resin from said first and second plated via holes, respectively;
      said filler particles of said first and second filler-containing layers being diffused into said resin of said prepreg layer located in said first and second plated via holes;
   (e) removing said first and second release films from said first and second subboards, respectively, while said diffused filler particles of said filler-containing layers remain in said resin of the prepreg layer;
   (f) polishing said outer sides of said first and second subboards of said laminated board to remove said first and second protruding parts of said resin of the prepreg layer;
   (g) removing said filler particles remaining in said resin of said prepreg layer by dissolving said filler particles to roughen first and second surfaces of said resin located in said first and second plated via holes; and
   (h) forming first and second mounting pads on said roughened first and second surfaces of said resin of said prepreg layer located in said first and second plated via holes, thereby covering said first and second plated via holes by said first and second mounting pads, respectively.

2. A method as claimed in claim 1, wherein said filler particles are made of an inorganic material that is dissolved by contacting said filler particles with a solvent.

3. A method as claimed in claim 1, wherein said filler particles are made of one selected from the group consisting of calcium carbonate, silicic acid anhydride, and silica.

4. A method as claimed in claim 3, wherein when said filler particles are made of calcium carbonate, said solvent is hydrochloric acid, when said filler particles are made of silicic acid anhydride, said solvent is hydrofluoric acid, and when said filler particles are made of silica, said solvent is hydrochloric acid or sulfuric acid.

5. A fabrication method of a multilayer PWB, Comprising the steps of:
   (a) forming a first surface via hole in a first subboard;
   (b) forming a second surface via hole in a second subboard;
   (c) laminating said first and second subboards while placing an inner structure including a prepreg layer between said first and second subboards;
      said first and second surface via holes being filled with a resin contained in said prepreg layer;
      filler particles being buried into first and second surface regions of said resin which are located in said first and second surface via holes, respectively;
   (d) removing said filler particles buried into said first and second surface regions of said resin by dissolving said filler particles, thereby roughening said first and second surface regions of said resin; and
   (e) forming first and second mounting pads to be contacted with said roughened first and second surface regions of said resin, respectively.

6. A method as claimed in claim 5, wherein said filler particles are made of an inorganic material that is dissolved by contacting said filler particles with a solvent.

7. A method as claimed in claim 5, wherein said filler particles are made of one selected from the group consisting of calcium carbonate, silicic acid anhydride, and silica.

8. A method as claimed in claim 7, wherein when said filler particles are made of calcium carbonate, said solvent is hydrochloric acid, when said filler particles are made of silicic acid anhydride, said solvent is hydrofluoric acid, and when said filler particles are made of silica, said solvent is hydrochloric acid or sulfuric acid.

* * * * *